United States Patent
Lee et al.

(10) Patent No.: US 6,911,369 B2
(45) Date of Patent: Jun. 28, 2005

(54) DISCONTINUITY PREVENTION FOR SIGE DEPOSITION

(75) Inventors: Kuen-Chyr Lee, Hsin-Chu (TW); Liang-Gi Yao, Hsin-Chu (TW); Fu Chin Yang, Hsin-Chu (TW); Shih-Chang Chen, Hsin-Chu (TW); Mong-Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 65 days.

(21) Appl. No.: 10/365,257

(22) Filed: Feb. 12, 2003

(65) Prior Publication Data

US 2004/0157399 A1 Aug. 12, 2004

(51) Int. Cl.[7] .............................................. H01L 21/331
(52) U.S. Cl. .......................... 438/313; 438/314; 438/320
(58) Field of Search ................................. 438/313, 314, 438/320, 357, 361, 369

(56) References Cited

U.S. PATENT DOCUMENTS

| 6,288,427 | B2 | 9/2001 | Huang |
| 6,362,065 | B1 | 3/2002 | Swanson et al. |
| 6,437,376 | B1 | 8/2002 | Ozkan |
| 6,444,591 | B1 | 9/2002 | Schuegraf et al. |
| 6,461,925 | B1 | 10/2002 | John et al. |
| 6,780,725 | B2 * | 8/2004 | Fujimaki .................... 438/313 |

\* cited by examiner

*Primary Examiner*—Kevin M. Picardat
(74) *Attorney, Agent, or Firm*—Haynes and Boone, LLP

(57) ABSTRACT

The present disclosure provides a process for producing a SiGe layer in a bipolar device having a reduced amount of gaps or discontinuities on a shallow trench isolation (STI) region use for a base electrode connection. The process is used for forming an SiGe layer for use in a semiconductor device. The process includes doping a single crystal substrate with a first dopant type, baking the doped single crystal substrate at a temperature less than 900° C., and at a pressure less than 100 torr; and depositing the SiGe layer on the baked single crystal substrate (epi SiGe) to serve as the base electrode and on the STI region (poly SiGe) to serve as a connection for the base electrode. The semiconductor device is thereby created from the combination of the doped single crystal substrate and the deposited SiGe layer.

16 Claims, 2 Drawing Sheets

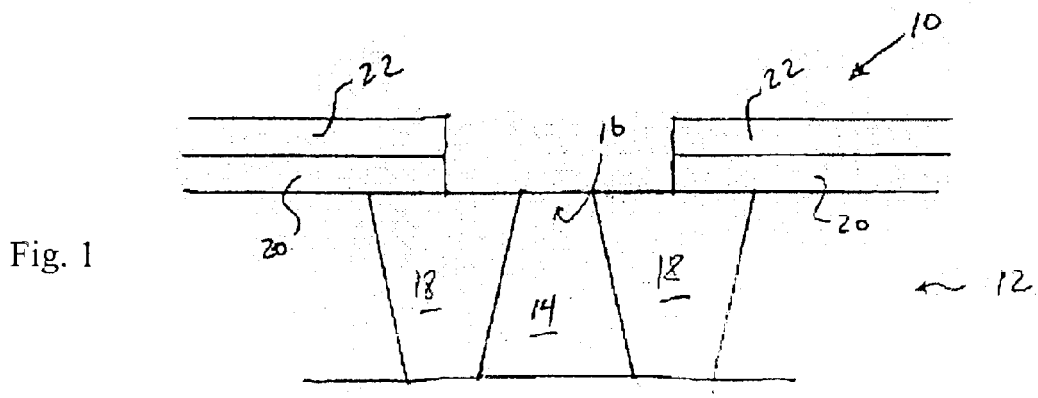
Fig. 1
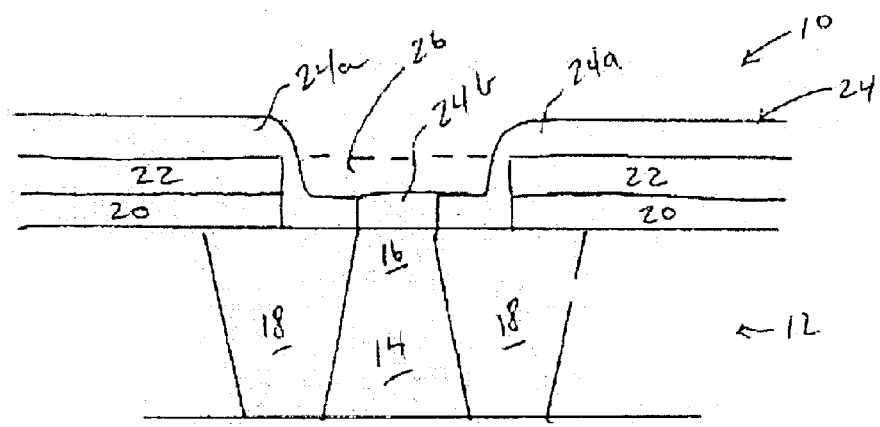
Fig. 2
Fig. 3
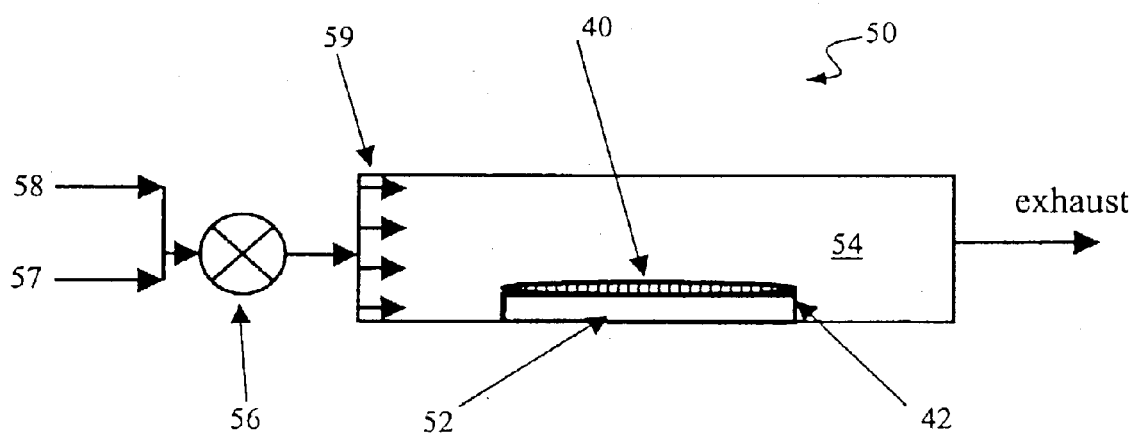

DISCONTINUITY PREVENTION FOR SIGE DEPOSITION

BACKGROUND OF THE INVENTION

The present disclosure relates generally to the fabrication of semiconductor devices, and more particularly, to a method and process for depositing a silicon germanium alloy onto a semiconductor substrate.

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.35 um and even 90 nm feature sizes.

Bipolar transistors are important components in, for example, logic circuits, communications systems, and microwave devices. A bipolar transistor is essentially a three terminal device having three regions, an emitter, base and collector region, wherein the emitter and collector regions are of one conductivity type and the base is of another.

Since the advent of bipolar transistors, many attempts have been made to improve the performance of the transistor. However, as device characteristics have decreased and speed and performance requirements have increased, the composition of the different portions of the bipolar transistor become critical.

For example, in one type of heterojunction transistor, the transistor is formed with a silicon collector region, a base region composed of a silicon-germanium (SiGe) alloy, and a silicon emitter region. The mixed crystal semiconductor base layer may have a uniform distribution of germanium in silicon or may contain a graded distribution of germanium in the silicon. The graded SiGe distribution is often provided in order to increase the bandgap of the transistor. With the above described structure of a wide bandgap transistor and the fact that germanium has a large electron mobility, performance of the transistor is enhanced.

However, a problem often occurs during deposition of the SiGe base layer. Specifically, discontinuities begin to appear when SiGe is deposited between a combination of silicon, oxide, and poly films, expecially on shallow trench isolation (STI) oxide. The discontinuities appear as gaps in the SiGe layer on STI oxide, which causes poor poly sheet resistance for connection with the base electrode.

This problem is exacerbated by further attempts to improve heterojunction bipolar transistor performance, such as decreasing the width of the base region of a transistor and decreasing the base transit time for a constant base width. Also, it is important not to adjust any processing requirements which may introduce defects into the single-crystal substrate or change the chemical profile of the SiGe layer.

What is needed is a method and process to form an improved poly SiGe deposition layer on STI oxide for connection with a base electrode and with a reduced number of discontinuities.

SUMMARY OF THE INVENTION

The present disclosure provides a method for reducing or preventing discontinuities in a SiGe layer, and devices produced by such method. In one embodiment, a method of forming a bipolar transistor device is provided. The method includes doping an epi layer with a first dopant type, forming a shallow trench isolation (STI) region in a portion of the epi layer, overlying a portion of the STI region with an oxide layer, and overlying the oxide layer with a poly layer. The doped epi layer, oxide layer, and poly layer are baked with H2 at a temperature less than 900° C., and at a pressure less than 100 torr. SiGe is deposited to form an epi SiGe layer overlying the baked epi layer, and a poly SiGe layer overlying the STI region and the poly layer.

In some embodiments, native oxide is removed from the single crystal substrate during the baking, which thereby prevents crystal defects on the base electrode.

In some embodiments, the SiGe layer includes a second dopant type different from the first dopant type. For example, the first dopant type can be an n-type and the second dopant type can be a p-type.

In another embodiment, a method for forming a SiGe layer for use in a semiconductor device is provided. The method includes doping a single crystal substrate with a first dopant type, isolating a portion of the doped single crystal substrate with an isolation region, and layering at least one of either oxide or poly on a portion of the isolation region. The doped single crystal substrate and at least one of either oxide or poly is baked with H2 at a pressure less than 100 torr and the SiGe layer is deposited on the isolated baked single crystal substrate. The semiconductor device is thereby created from the combination of the doped single crystal substrate and the deposited SiGe layer.

In another embodiment, a heterojunction bipolar transistor (HBT) device having a SiGe layer base electrode with relatively few discontinuities is provided. The HBT device includes a single crystal substrate doped with a first dopant type and having a native oxide removed by baking in an H2 environment at a pressure less than 350 torr and a temperature less than 900° C. The HBT also includes a shallow trench isolation (STI) region in the single crystal substrate, an oxide layer overlying the STI region, a poly layer overlying the oxide layer, and an SiGe layer deposited on the single crystal substrate and the STI region for making the SiGe layer base electrode. The HBT device is thereby created from the combination of the doped single crystal substrate and the SiGe layer base electrode.

In some embodiments, the HBT device further includes a conductive layer of the first dopant type formed over the SiGe layer.

BRIEF DESCRIPTION OF THE DRAWINGS

FIGS. 1–2 illustrate progressions in processing a SiGe heterojunction bipolar transistor (HBT) according to one embodiment of the present invention.

FIG. 3 illustrates an apparatus for implementing one embodiment of a furnace capable of implementing the present invention.

DETAILED DESCRIPTION

Figure 4:
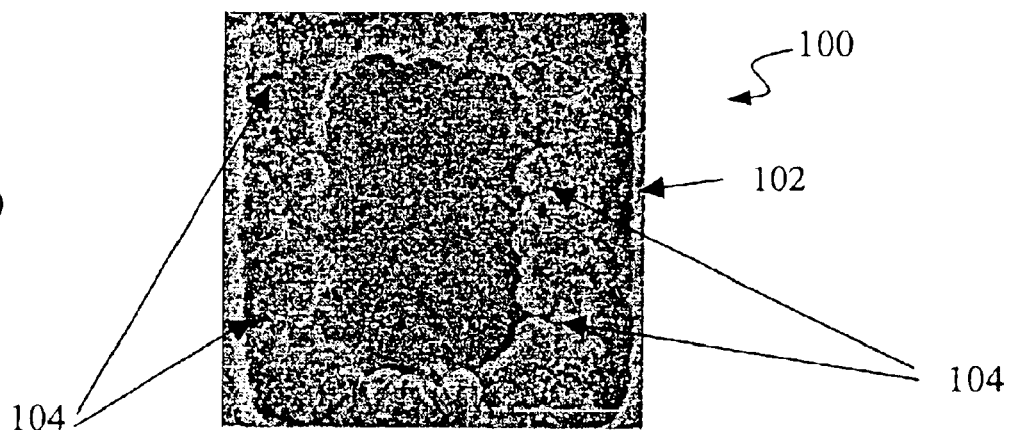
FIG. 4 is a picture of a SiGe layer according to the prior art.

The present invention provides a system and method for producing a SiGe layer in a bipolar device having a reduced amount of gaps or discontinuities. To illustrate the invention, a specific example and configuration of a heterojunction bipolar transistor (HBT) is illustrated and discussed. It is understood, however, that this specific example is only provided to teach the broader inventive concept, and one of ordinary skill in the art can easily apply the teachings of the present disclosure to other semiconductor devices and structures. Also, it is understood that the HBT discussed in the present disclosure include many conventional structures formed by conventional processes. Since these structures and processes are well known in the art, they will only be discussed in a general level of detail.

Referring to FIG. 1, a bipolar transistor 10 is created using several different process steps. The transistor 10 is formed on an epi layer 12 of a single crystal semiconductor substrate. The epi layer 12 is beneficial because it has a desired lattice structure for building the bipolar transistor. In the present embodiment, the epi layer 12 is a lightly doped n-type silicon substrate. Although not shown, the epi layer 12 may be isolated from further portions of the substrate, such as by using a buried oxide layer. An n-type collector region 14 is formed in the epi layer 12, and a collector interface 16 is defined by the formation of laterally spaced isolation regions 18.

In the present embodiment, the isolation regions 18 are shallow trench isolation (STI) regions. The STI regions 18 can be formed using standard processing techniques, such as etching the shallow trenches and filling them with oxide.

Next, a layer of tetraethylorthosilicate (TEOS) oxide 20 is formed on top of the substrate 12 and a poly layer 22 is formed on the TEOS oxide layer. In the present embodiment, the TEOS oxide 20 and the poly 22 overly at least a portion of the STI regions 18, but do not overly the collector interface 16.

Referring now to FIG. 2, a p-type SiGe base layer 24a, 24b is then formed over the collector interface 16 and the poly 22. In the present embodiment, the SiGe base layer 24 is doped with boron, which is a p-type dopant, although other doping materials can be used to accommodate different configurations (e.g., pnp). The portion of the SiGe base layer over poly is designated SiGe poly 24a, and the portion of the SiGe base layer over the epi layer 12 at the collector interface 16 is designated SiGe epi 24b. This forms a base electrode. Shown in phantom, an n-type polysilicon emitter region layer 26 may be later applied to overly the SiGe base layer 24.

The SiGe base layer 24 is produced, in the present example, using an H2 prebake process and a Silicon and Germanium deposition process. For the sake of further example, the creation of the SiGe layer 24 can be illustrated with respect a simplified furnace reactor.

Referring also to FIG. 3, a wafer 40 on which the SiGe base layer 24 can be created is positioned on a pedestal 42 inside of a furnace reactor 50. In one embodiment, the reactor 50 includes a heating element 52 for providing a baking temperature of about 850° C. inside the reactor chamber 54. A valve 56 can be used to control the supply of a baking gas 57, such as H2, into the chamber 54 and a deposition source 58, such as the constituents needed to creat SiGe. The output of the valve 56 is provided to one or more injectors 59, which provides material to the reactor chamber 54. The baking gas (H2) 57 is provided for an H2 prebake, and the deposition constituents can then be provided in-situ. It is understood that different combinations of valves and deposition mechanisms can be used to facilitate design choices pertaining to different fabs and/or different manufactures of furnace reactors.

It is typical to perform H2 baking at a pressure of about 760 torr inside the chamber 54. However, according to the present invention, a lower pressure is used for H2 baking. In the present embodiment, a pressure of 100 torr to 10 torr, or less, is created inside the chamber 54 for H2 baking.

The H2 bake serves to remove native oxide on the epi layer 12 in order to prevent crystal defects on the SiGe epi 24b. However, the H2 bake will create gaps or discontinuities due to Si pre-crystallization on the STI regions 18 and the poly film 22. After the low pressure H2 baking has been performed, the SiGe layer 24 is deposited onto the wafer 40. As a result of the low pressure H2 baking, it has been found that relatively few discontinuities will be formed in the SiGe base layer 24. Furthermore, the number of discontinuities has been reduced without performing processing operations that would otherwise introduce crystal defects due to native oxide residue and/or change the profile of SiGe to boron (or other dopant).

Figure 5:
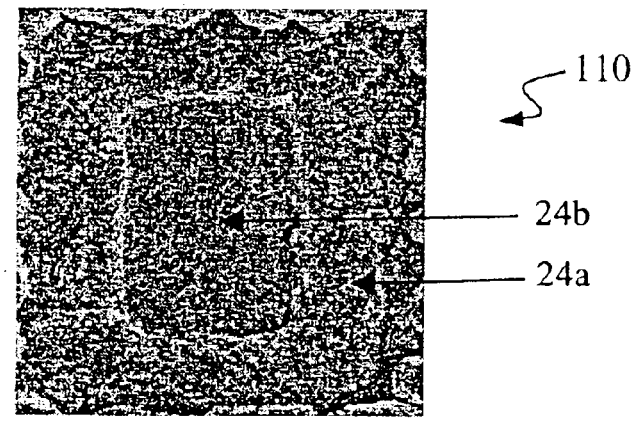
FIG. 5 is a picture of a SiGe layer with reduced amounts of discontinuities created according to the present invention.

Referring to FIG. 4, a picture 100 shows a SiGe layer 102 that was H2 baked at 760 torr. As can be seen, the SiGe layer 102 includes many discontinuities 104. Referring to FIG. 5, a picture 110 shows the SiGe layer 24a according to one embodiment of the present invention. The SiGe layer 24a was produced using the same recipe and same processing facilities as the prior art SiGe layer 102 (FIG. 4), with the exception that the H2 bake pressure was at 10 torr. Noticeably, there are no visible discontinuities in the SiGe layer 24a.

By reducing the number of discontinuities, several benefits are achieved. For one, poly sheet resistance connected to the base electrode is improved. Also, the termperature of SiGe deposition is kept to at the previous level, so that no new processing abnormalities are created. For example, the profile of SiGe to boron is maintained. Further, there is no change to the thermobudget set for producing the SiGe layer 24. Instead, the reduction in atmospheric pressure has little to no affect on the thermobudget. Further still, a base current ($I_b$) associated with the SiGe base layer 24 remain very uniform from device to device.

It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method of forming a bipolar transistor device, the method comprising:

doping an epi layer with a first dopant type;

forming a shallow trench isolation (STI) region in a portion of the epi layer;

overlying a portion of the STI region with an oxide layer;

overlying the oxide layer with a poly layer;

baking the doped epi layer, oxide layer, and poly layer with H2 at a temperature less than 900° C., and at a pressure less than 100 torr;

depositing SiGe to form an epi SiGe layer overlying the baked epi layer, and to form a poly SiGe layer overlying the STI region and the poly layer.

2. The method of claim 1 further comprising:

forming an epi SiGe base electrode on the epi layer.

3. The method of claim 1 wherein the SiGe layer includes a second dopant type different from the first dopant type.

4. The method of claim 1 further comprising:

forming a conductive layer of the first dopant type over the epi SiGe layer;

wherein the combination of the doped substrate, the epi SiGe layer, and the conductive layer create a bipolar transistor device.

5. A method for forming a SiGe layer for use in a semiconductor device, the method comprising:
- doping a single crystal substrate with a first dopant type;
- isolating a portion of the doped single crystal substrate with an isolation region;
- layering at least one of either oxide or poly on a portion of the isolation region;
- prebaking the doped single crystal substrate and at least one of either oxide or poly with H2 at a pressure less than 100 torr; and
- depositing the SiGe layer on the isolated baked single crystal substrate;
- whereby the semiconductor device is created from the combination of the doped single crystal substrate and the deposited SiGe layer.

6. The method of claim 5 further comprising:
layering the other of the either oxide or poly on the portion of the isolation region.

7. The method of claim 5 wherein the isolating utilizes a shallow trench isolation.

8. The method of claim 5 wherein the baking is performed at a pressure less than 50 torr.

9. The method of claim 5 wherein the SiGe layer includes a second dopant type different from the first dopant type.

10. The method of claim 5 wherein the first dopant type is an n-type and the second dopant type is a p-type.

11. The method of claim 5 wherein the single crystal substrate is an epi layer on a silicon wafer.

12. The method of claim 5 further comprising:
forming a conductive layer of the first dopant type over the SiGe layer;
wherein the combination of the doped substrate, the SiGe layer, and the conductive layer create a bipolar transistor device.

13. A method comprising an integrated circuit component, including:
- fabricating a device portion having first and second parts with respective first and second surface portions thereon, the first part being a semiconductor material, and the second part being one of an oxide material and a poly material;
- thereafter baking the device portion with H2 at a pressure less than 100 Torr; and
- thereafter forming a layer of SiGe on at least the first and second surface portions.

14. The method of claim 13, wherein the baking is carried out at a pressure less than 50 Torr.

15. The method of claim 13, wherein the baking is carried out at a temperature less than 900° C.

16. The method of claim 13, wherein the first material is an epi layer.

* * * * *